(12) United States Patent
Kinoshita et al.

(10) Patent No.: US 6,272,034 B1
(45) Date of Patent: Aug. 7, 2001

(54) SEMICONDUCTOR MEMORY DEVICE

(75) Inventors: Mitsuya Kinoshita; Fukashi Morishita; Kazutami Arimoto; Takeshi Fujino; Tetsushi Tanizaki; Takahiro Tsuruda; Teruhiko Amano; Mako Kobayashi, all of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/606,402

(22) Filed: Jun. 29, 2000

Related U.S. Application Data

(62) Division of application No. 09/113,510, filed on Jul. 10, 1998, now abandoned.

(30) Foreign Application Priority Data

Jan. 29, 1998 (JP) .................................................. 10-016646

(51) Int. Cl.⁷ .................................................... G11C 5/02
(52) U.S. Cl. ................................................ 365/52; 365/63
(58) Field of Search ........................ 364/52–63; 361/719, 361/697, 703; 257/712, 713, 717, 675, 797, 720

(56) References Cited

U.S. PATENT DOCUMENTS

| | | |
|---|---|---|
| 4,748,495 | 5/1988 | Kucharek . |
| 4,773,868 * | 9/1988 | Heinecke ............................. 361/393 |
| 5,208,782 | 5/1993 | Sakuta et al. .................... 365/230.03 |
| 5,357,478 | 10/1994 | Kikuda et al. ................... 365/230.03 |
| 5,710,733 | 1/1998 | Chengson et al. . |
| 5,910,685 * | 6/1999 | Watanabe .............................. 257/777 |
| 5,926,371 | 7/1999 | Dolbear . |
| 5,933,709 | 8/1999 | Chun . |
| 5,943,285 | 8/1999 | Kohno . |
| 5,946,190 * | 8/1999 | Patel .................................... 361/700 |
| 5,949,654 * | 9/1999 | Fukuoka .............................. 361/760 |

FOREIGN PATENT DOCUMENTS

| | | |
|---|---|---|
| 4-130655 | 5/1992 | (JP) . |
| 5-47967 | 2/1993 | (JP) . |
| 8-212774 | 8/1996 | (JP) . |
| 9-74171 | 3/1997 | (JP) . |

OTHER PUBLICATIONS

"A 1.6GB/s Data-Rate 1Gb Synchronous DRAM with Hierarchical Square-Shaped Memory Block and Distributed Bank Architecture", by Nitta et al., 1996 IEEE International Solid-State Circuits Conference 1996 Digest of Technical Papers.

* cited by examiner

*Primary Examiner*—Amir Zarabian
(74) *Attorney, Agent, or Firm*—McDermott, Will & Emery

(57) ABSTRACT

A control circuit portion which controls the operations of memory cells is concentrated in a central portion and heat radiation plates are placed thereon via adhesive. A semiconductor integrated circuit having a function of the MPU or the like is placed above the control circuit portion via a bump electrode. The control circuit portion and a memory block are formed on separate chips respectively.

4 Claims, 10 Drawing Sheets

SEMICONDUCTOR MEMORY DEVICE

This application is a Div. of Ser. No. 09/113,510, Jul. 10, 1998, now abandoned.

BACKGROUND OF THE INVENTION

1. Field of the Invention

The present invention relates to a semiconductor memory device.

2. Description of the Background Art

The DRAM (Dynamic Random Access Memory) is conventionally known widely as one example of a semiconductor memory device. The DRAM includes a memory block where memory cells that are generally storage elements are formed and a peripheral circuit portion where a peripheral circuit which controls the operation of memory cells is formed. If four memory blocks are provided to a conventional DRAM, for example, the peripheral circuit portion has a cross shape. A problem of this conventional DRAM is that signal delay between each memory block and the peripheral circuit portion is not uniform.

According to a layout proposed for solving the problem above, the peripheral circuit portion is concentrated in the central portion surrounded by a plurality of memory blocks. One example of such a layout is shown in FIG. 10.

Referring to FIG. 10, a chip (DRAM) 1 includes eight (8) memory blocks 7a–7h formed on a main surface of a semiconductor substrate 2, and a control circuit portion 3 arranged at a central portion surrounded by the memory blocks. Control circuit portion 3 corresponds to the peripheral circuit portion described above. The length of signal interconnection lines can be made uniform easily by placing memory blocks 7a–7h around control circuit portion 3, and signal delay between control circuit portion 3 and memory blocks 7a–7h can be made uniform.

However, the DRAM shown in FIG. 10 also has a following problem.

The conventional DRAM was not required to achieve a high speed operation which necessitates provision of any heat radiation member. Therefore, it was enough to dissipate heat from a package or a lead frame. As operating frequency of the recent MPU is enhanced, a DRAM operating at a high frequency of 100 MHz or more is required. In this case, generation of heat per unit area at the central portion of chip 1 increases compared with the conventional DRAM, since control circuit portion 3 including any circuit which generates much heat is concentrated in the central portion of chip 1. Consequently, heat is not sufficiently radiated to cause thermal destruction.

If functions of the MPU, Cache, BIST (Built In Self Test) circuit, DRAM for parity and the like can be added after chip 1 is formed, various functions can be added to chip 1 of one type. However, if the structure shown in FIG. 10 is used, those functions as described above cannot be added onto chip 1 selectively since chip 1 is not provided with any pad for interconnection between chips.

Redundancy repair means are respectively provided to memory blocks 7a–7h. However, if any one of memory blocks 7a–7h has a defect which cannot be repaired by the redundancy repair means, the entire chip 1 is determined to be a defective product even if remaining memory blocks are acceptable ones. If the memory block which cannot be repaired can be replaced with an acceptable one, redundancy repairing of chip 1 is possible to improve yield. However, the whole chip 1 is conventionally formed on a single semiconductor chip, and the redundancy repairing of the chip was impossible. As a result, the yield is decreased.

SUMMARY OF THE INVENTION

The present invention is made to solve such problems as described above. One object of the present invention is to provide a semiconductor memory device by which heat of a control circuit portion can be efficiently radiated when the control circuit portion is arranged to be surrounded by memory blocks.

Another object of the present invention is to provide a semiconductor memory device to which functions of MPU and the like can be selectively added.

Still another object of the present invention is to provide a semiconductor memory device by which yield can be improved.

A semiconductor memory device according to one aspect of the invention includes a plurality of memory blocks, a control circuit portion, and a heat radiation member. A plurality of memory cells are formed in each of the memory blocks. The control circuit portion is surrounded by the plurality of memory blocks, and includes a control circuit formed therein which controls operations of the memory cells. The heat radiation member is selectively placed on at least one of a front surface and a back surface of the control circuit portion, and has a function of radiating heat generated at the control circuit portion. The control circuit portion may be arranged to make signal delay between each memory block and the control circuit portion uniform.

Heat can be externally radiated from a portion where much heat is generated by selectively placing the heat radiation member on at least one of the front surface and the back surface of the control circuit portion. Consequently, an efficient heat radiation as well as reduction of cost are achieved compared with a case in which the heat radiation member is placed on the entire surface of the chip.

The semiconductor memory device as described above may be provided with a package. In this case, the heat radiation member preferably protrudes outward through the package. The package herein refers to any insulating member for forming an airtight seal of the chip.

Heat generated at the control circuit portion can be directly radiated from the package outward since the heat radiation member penetrates the package. As a result, an efficient heat radiation is achieved.

A semiconductor memory device according to another aspect of the present invention includes a first chip and a second chip. The first chip includes a plurality of memory blocks and a control circuit portion. A plurality of memory cells are formed in each of the plurality of memory blocks. The control circuit portion is surrounded by the plurality of memory blocks, and a control circuit which controls operations of memory cells is formed in the control circuit portion. A bump electrode is formed around the control circuit. The second chip is connected to the first chip via the bump electrode and arranged above the control circuit portion.

Functions of the MPU, Cache, BIST circuit, DRAM for parity and the like can be selectively added easily to the second chip which is separate from the first chip. By connecting the second chip to the first chip via the bump electrode, the functions described above of the MPU and the like can be selectively added to the semiconductor memory device which is, for example, a DRAM.

A bonding pad may be formed at a front surface of the second chip. Further, any heat radiation member for radiating heat generated at the control circuit portion or the second chip may be placed on at least one of the front surface of the second chip and a back surface of the control circuit portion.

By providing the second chip, the bonding pad can be formed easily on the front surface of the second chip. Consequently, a region where the bonding pad is formed is easily obtained. An efficient heat radiation becomes possible by providing the heat radiation member on at least one of the front surface of the second chip and the back surface of the control circuit portion.

According to still another aspect of the invention, a semiconductor memory device includes a plurality of memory block chips and a control circuit chip. A plurality of memory cells are formed at each of the memory block chips. The control circuit chip is surrounded by the memory block chips, and has a control circuit formed therein which controls operations of memory cells.

If, for example, one memory block chip is determined to be defective, only the defective memory block chip can be replaced with an acceptable memory block chip since the memory block chips and the control circuit chip are provided. Accordingly, a chip which must be discarded as defective is only a defective memory block chip, and yield can be improved compared with any conventional semiconductor memory device. An arbitrary number of memory block chips can be connected to the control circuit chip according to a function of the control circuit chip so that a semiconductor memory device having an arbitrary capacity can be obtained. The memory block chips and the control circuit chip can be integrally formed by the multi-tip module technique, for example.

The control circuit chip may include a redundancy programming circuit for repairing a defective row/column in the plurality of memory block chips.

By providing the redundancy programming circuit in the control circuit chip, a defective row/column in one memory block chip can be replaced with a redundant row/column in another memory block chip. If a redundant row/column is provided in the control circuit chip, a defective row/column in each memory block chip can be replaced with the redundant row/column in the control circuit chip. Consequently, even if a memory block chip is highly vulnerable to a defect, the chip can be repaired to contribute to improvement of yield of the semiconductor memory device.

The redundancy programming circuit may include an address programming unit storing an address of a redundant row/column, and a memory block chip inactivation signal generation circuit which detects an access instruction to a redundant row/column by an output from the address programming unit and inactivates a memory block chip. The address programming unit supplies a signal which shows whether a stored address and a supplied address correspond to each other or not to the memory block chip inactivation signal generation circuit.

By providing the address programming unit and the memory block chip inactivation signal generation circuit, a defective row/column which cannot be repaired in one memory block chip can be replaced with a redundant row/column in another memory block chip or the control circuit chip. Accordingly, a memory block having a defect which could not be repaired conventionally can be repaired, resulting in contribution to improvement of yield of the semiconductor memory device.

The control circuit chip may include a redundant row/column as described above.

By providing the redundant row/column in the control circuit chip, the redundant row/column can be replaced with a defective row/column in each memory block chip. Even if all of redundant rows/columns in each memory block chip are used up, the redundant row/column in the control chip can be replaced with a defective row/column in a memory block chip. As a result, the rate of defectiveness of the semiconductor memory device can be reduced and the yield can be enhanced.

Programming of a defective row/column may be carried out by an electrically writable antifuse element or the like.

Accordingly, laser trimming for the redundancy repair becomes unnecessary, so that productivity can be improved.

Further, a heat radiation member for radiating heat generated at the control circuit chip may be provided on at least one of a front surface and a back surface of the control circuit chip.

By providing the heat radiation member as described above, an efficient heat radiation is possible similarly to each aspect of the invention.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are hereinafter described using FIGS. 1–9.

(First Embodiment)

Figure 1:
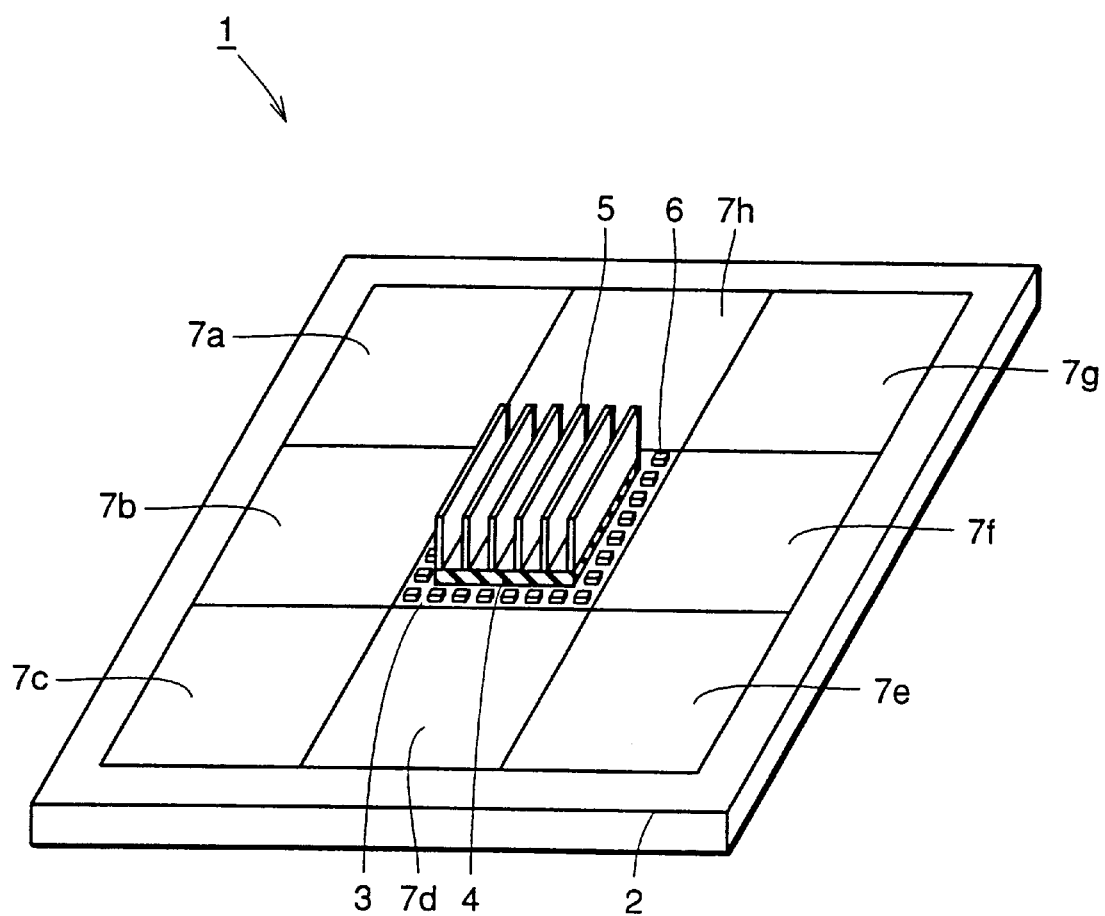
FIG. 1 is a perspective view showing a DRAM as a model according to the first embodiment of the invention.

Referring to FIGS. 1 and 2, the first embodiment of the invention is described. FIG. 1 is a perspective view showing a DRAM as a model according to the first embodiment of the invention.

Referring to FIG. 1, memory blocks 7a–7h and a control circuit portion 3 are formed at a main surface of a semiconductor substrate 2. A plurality of memory cells are formed in each of memory blocks 7a–7h. A control circuit which controls operations of memory cells is formed in control circuit portion 3.

Control circuit portion 3 is surrounded by eight (8) memory blocks 7a–7h in the manner shown in FIG. 1.

Control circuit portion 3 is arranged at a central portion of semiconductor substrate 2 so that signal delay between each of memory blocks 7a–7h and the control circuit is uniform. However, control circuit portion 3 is not necessarily arranged at the central portion of semiconductor substrate 2 if the signal delay between the control circuit and each memory block is uniform.

According to the first embodiment, a plurality of heat radiation plates 5 are placed to stand on a front surface of control circuit portion 3 via adhesive 4. In control circuit portion 3, the control circuit which generates much heat is concentrated. By providing heat radiation plates 5 selectively on the front surface of control circuit portion 3, the heat can be efficiently radiated. Heat radiation plates 5 are formed of material such as copper, for example, which has an excellent heat radiation feature. Heat radiation plates 5 are selectively provided only on control circuit portion 3 as shown in FIG. 1, so that the size of heat radiation plates 5 can be reduced compared with the case in which heat radiation plates 5 are provided on the entire front surface of chip 1. The cost of heat radiation plates 5 itself can be reduced accordingly.

Chip 1 according to the first embodiment makes it possible to provide a highly reliable semiconductor memory device at a low cost in which signal delay between the control circuit and memory blocks 7a–7h is uniform.

As shown in FIG. 1, a bonding bad 6 is formed on the front surface of control circuit portion 3 to surround heat radiation plates 5. However, bonding pad 6 may be arranged in memory blocks 7a–7h.

Although heat radiation plates 5 are placed on the front surface of control circuit portion 3, they may be selectively placed on the back surface of chip 1 on the back side of control circuit portion 3. In this case, the freedom of arrangement of bonding pad 6 is improved since the front surface of control circuit portion 3 is not covered with heat radiation plates 5.

Figure 2A:
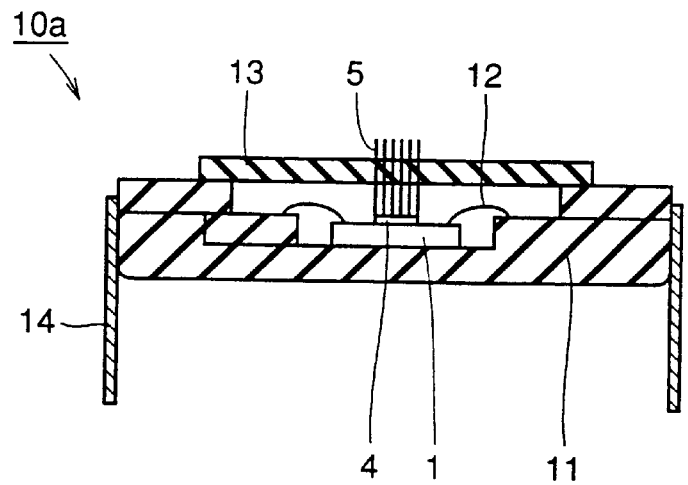
FIGS. 2A–2C are cross sections each showing a state in which the DRAM of FIG. 1 is airtightly sealed by a package.
Figure 2B:
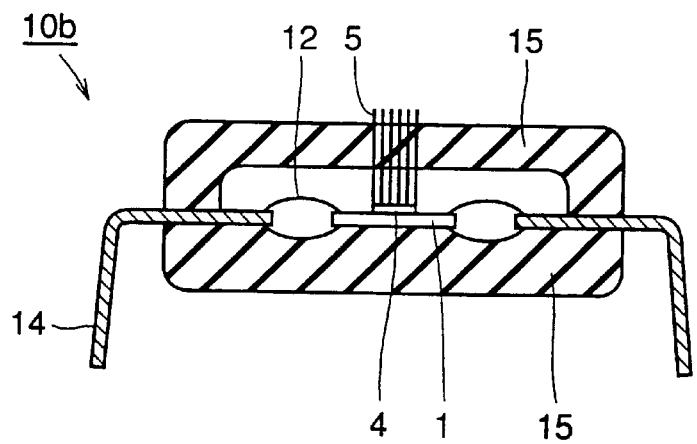
Figure 2C:
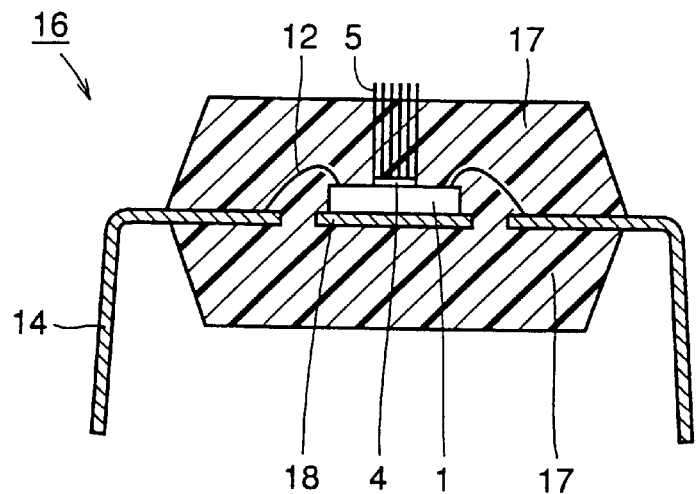

Referring to FIGS. 2A–2C, chip 1 sealed by a package is described. FIGS. 2A–2C are cross sectional views each showing chip 1 sealed airtightly by the package. An insulating member which is used for airtightly sealing chip 1 is herein referred to as a package.

Referring to FIG. 2A, chip 1 is arranged in a package 10a. Package 10a includes a laminated ceramic 11 and a cap 13. A metalized conductor is formed on a surface of laminated ceramic 11, and the conductor is electrically connected to semiconductor chip 1 with a wire 12. On both edges of package 10a, leads 14 are placed. Heat radiation plates 5 protrude outward through cap 13. Heat can be directly radiated from heat radiation plates 5 into the outside air around package 10a by providing heat radiation plates 5 protruding on the outside of package 10a.

Referring to FIG. 2B next, a package 10b shown in FIG. 2B is formed of a ceramic 15. Heat radiation plates 5 also protrude outward through ceramic 15. The effect as described above is thus obtained.

Referring to FIG. 2C, a package 16 is formed of mold resin. When such package 16 is employed, heat radiation plates 5 are provided such that they protrude outward from package 16 through a mold resin 17. Chip 1 is arranged on a die pad 18, and chip 1 is electrically connected to lead 14 via wire 12. The effect described above can also be expected.

(Second Embodiment)

Figure 3:
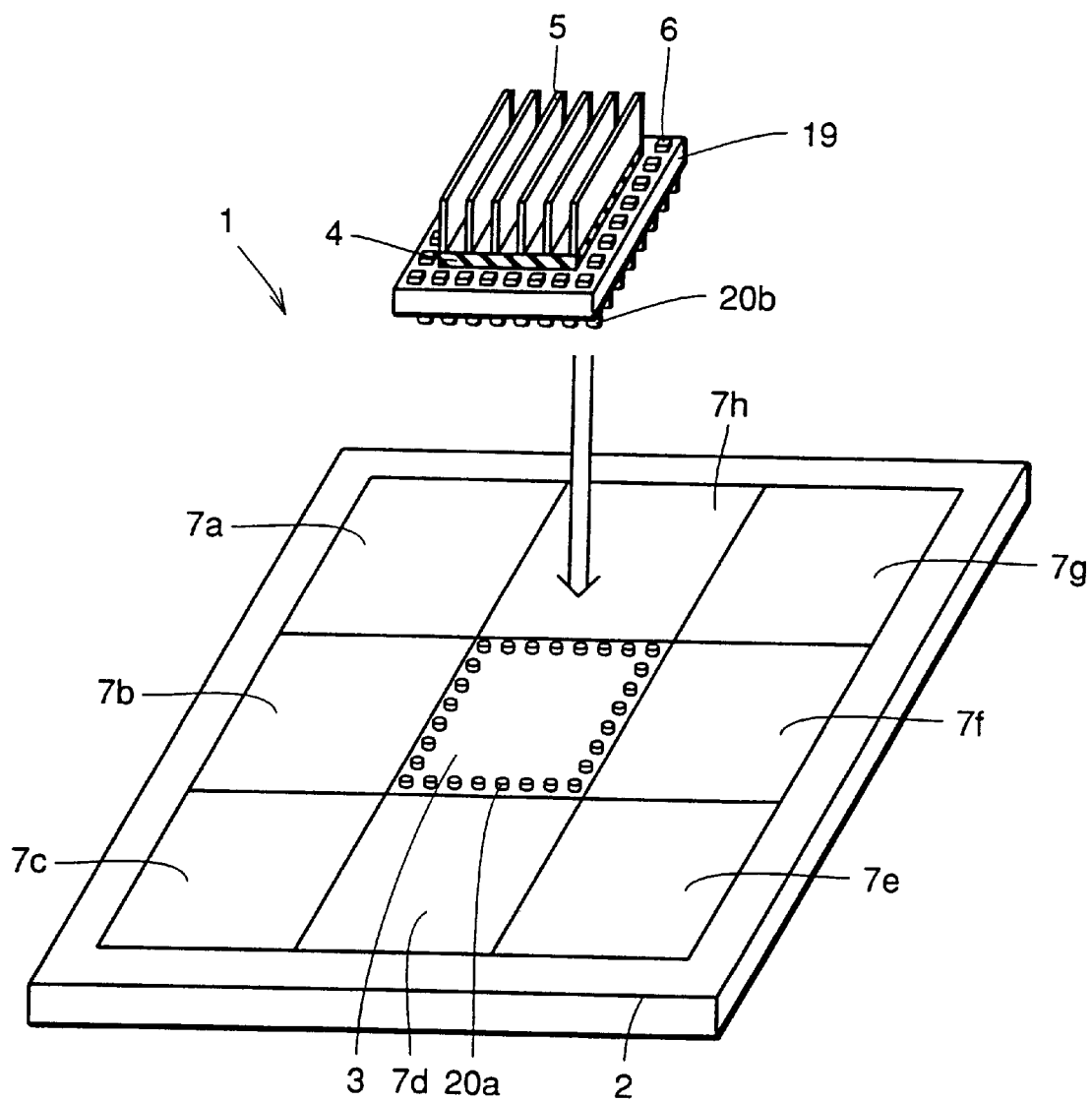
FIG. 3 is a perspective view showing a DRAM according to the second embodiment of the invention as a model.

Referring to FIG. 3, the second embodiment of the present invention is described. FIG. 3 is a perspective view showing a DRAM according to the second embodiment of the invention.

Referring to FIG. 3, according to the second embodiment, a plurality of bump electrodes 20a are placed on the periphery of control circuit portion 3. In addition to chip 1, a semiconductor integrated circuit 19 is provided separately. At least one of functions of the MPU, Cache, BIST circuit, DRAM for parity and the like is provided to integrated circuit 19.

Bump electrodes 20b are formed on a surface of semiconductor integrated circuit 19, and bump electrodes 20b are fused with bump electrodes 20a. Consequently, semiconductor integrated circuit 19 is placed on chip 1 including memory blocks 7a–7h and control circuit portion 3. Accordingly, functions of the MPU and the like can be selectively provided to the DRAM.

Chip 1 and semiconductor integrated circuit 19 are constructed of separate chips as described above. The cost of chip 1 can be reduced by mass production, and semiconductor integrated circuit 19 can be manufactured at a low cost and manufactured by integrating a bipolar element, a high frequency element and the like where the integration is difficult by the wafer process of the DRAM. As a result, a low cost and low-volume production in a large variety is achieved.

According to the second embodiment, heat radiation plates 5 may be placed on at least one of a front surface of semiconductor integrated circuit 19 and a back surface of control circuit portion 3 as in the case of the first embodiment. Consequently, an efficient heat radiation is achieved. Bonding pad 6 may be formed on the front surface of semiconductor integrated circuit 19 to surround heat radiation plates 5.

(Third Embodiment)

Figure 4:
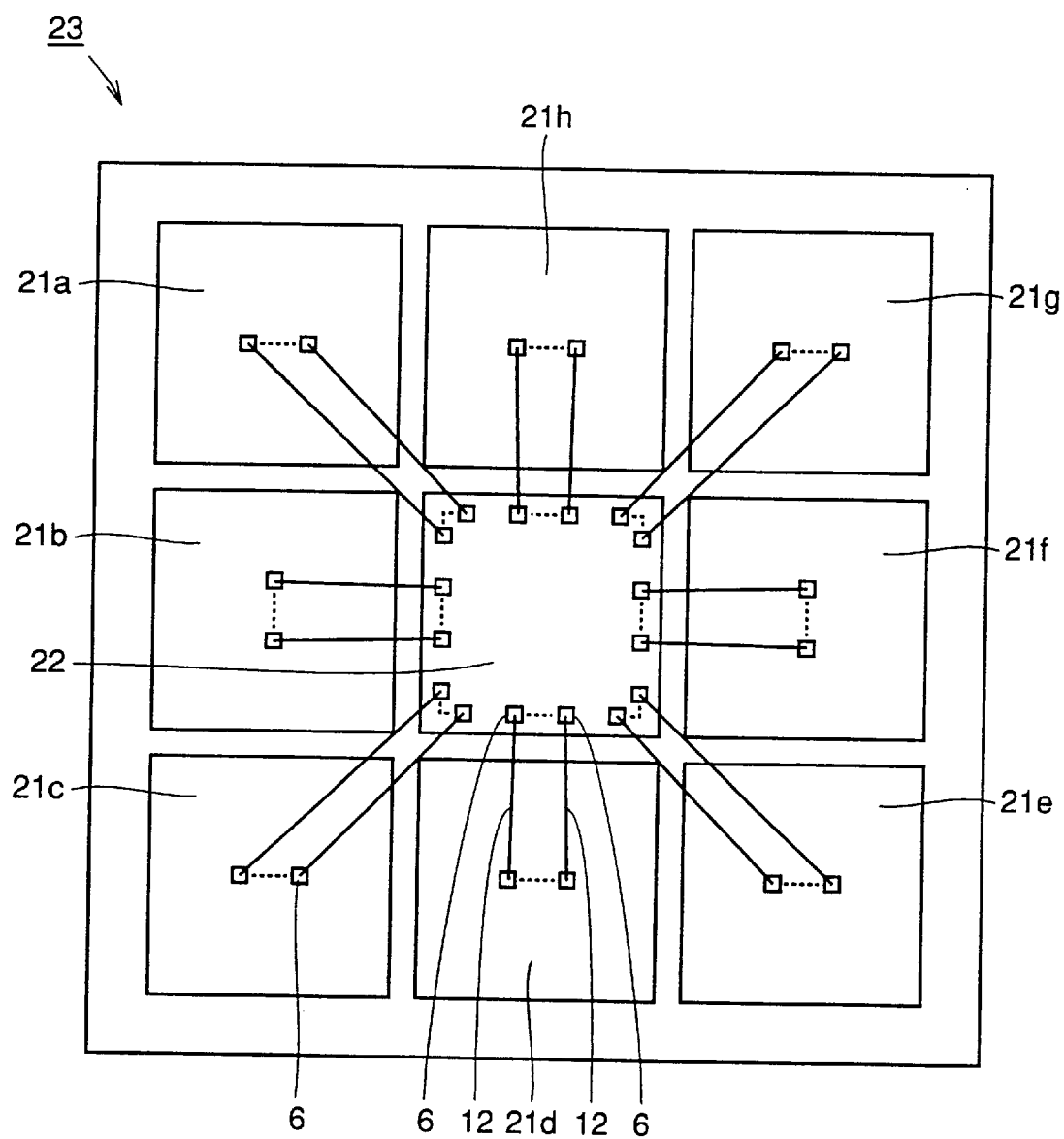
FIG. 4 is a plan view of a DRAM according to the third embodiment of the invention.
Figure 5:
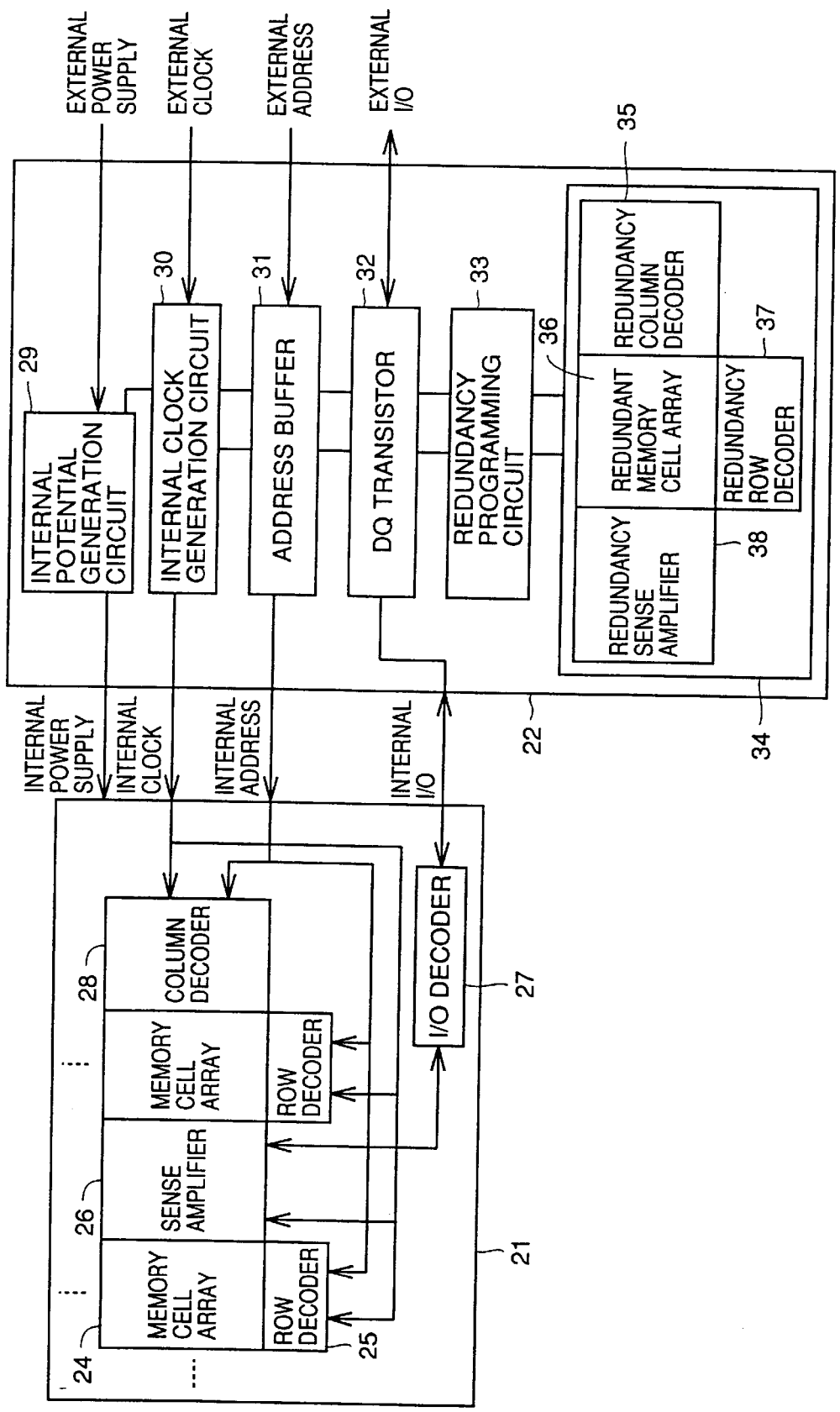
FIG. 5 is a block diagram showing one example of structures of a memory block chip and a control circuit chip shown in FIG. 4.

The third embodiment of the invention is described using FIGS. 4 and 5. FIG. 4 is a plan view showing a multi-chip module (DRAM) 23 as a model according to the third embodiment.

Referring to FIG. 4, according to the third embodiment, memory block chips 21a–21h where memory cells are formed and a control circuit chip 22 where a control circuit is formed are provided. A plurality of bonding pads 6 are placed on the periphery of control circuit chip 22 to be electrically connected to bonding pads 6 formed on memory block chips 21a–21h respectively via wires 12. Control circuit chip 22 and memory block chips 21a–21h are integrated by the multi-chip module technique. Memory block chips 21b and 21f are arranged in a direction different by 90° from directions of other memory block chips 21a, 21c–21e, 2g and 21h.

The memory blocks and the control circuit formed on separate chips produce an effect described below.

If memory block chip 21a has a defect which cannot be repaired by a conventional redundancy repairing means and remaining memory block chips 2b–21h are acceptable ones, for example, only memory block chip 21a can be replaced with an acceptable memory block chip. According to a conventional semiconductor memory device, if there is a defect in one memory block which cannot be repaired by redundancy repairing means, other acceptable memory blocks must be discarded as defective ones. On the other hand, according to this embodiment, only memory block chip 21a having a defect which cannot be repaired by the redundancy repairing means can be selectively replaced with an acceptable memory block chip. Consequently, other acceptable memory block chips 2b–21h can be effectively utilized. As a result, a memory block which must be discarded as defective one is only the memory block in the defective memory block chip 21a, and the yield can be enhanced accordingly.

Since memory block chips 21a–21h are provided separately from control circuit chip 22, a high volume production is possible to reduce the cost easily. Further, an arbitrary number of memory block chips can be connected to control circuit chip 22 only by replacing control circuit chip 22. A DRAM having an arbitrary capacity is thus obtained using memory block chips fabricated by the same wafer process.

One example of structures of a memory block chip 21 and a control circuit chip 22 is next described using FIG. 5. FIG. 5 is a block diagram showing structures of memory block chip 21 and control circuit chip 22.

Referring to FIG. 5, memory block chip 21 includes a memory cell array 24, a row decoder 25 selecting a word line, a sense amplifier 26, a column decoder 28 selecting a bit line, and an I/O decoder 27.

Control circuit chip 22 includes an internal potential generation circuit 29, an internal clock generation circuit 30, an address buffer 31 converting an external address to an internal address, a DQ transistor 32, a redundancy programming circuit 33, and a redundancy array circuit 34. Redundancy array circuit 34 includes a redundant memory cell array (redundant row/column) 36, redundancy column decoder 35, a redundancy row decoder 37, and a redundancy sense amplifier 38.

Circuits which generate much heat are concentrated within control circuit chip 22 as described above. An efficient heat radiation is also possible as in the case of each embodiment described above by providing heat radiation plates 5 as shown in FIG. 3 on at least one of a front surface and a back surface of control circuit chip 22 (not shown in FIG. 4).

Redundancy array circuit 34 may be provided to at least one of control circuit chip 22 and memory block chip 21. Any circuit among those shown in FIG. 5 which produces less heat may be placed in memory block chip 21.

(Fourth Embodiment)

Figure 6:
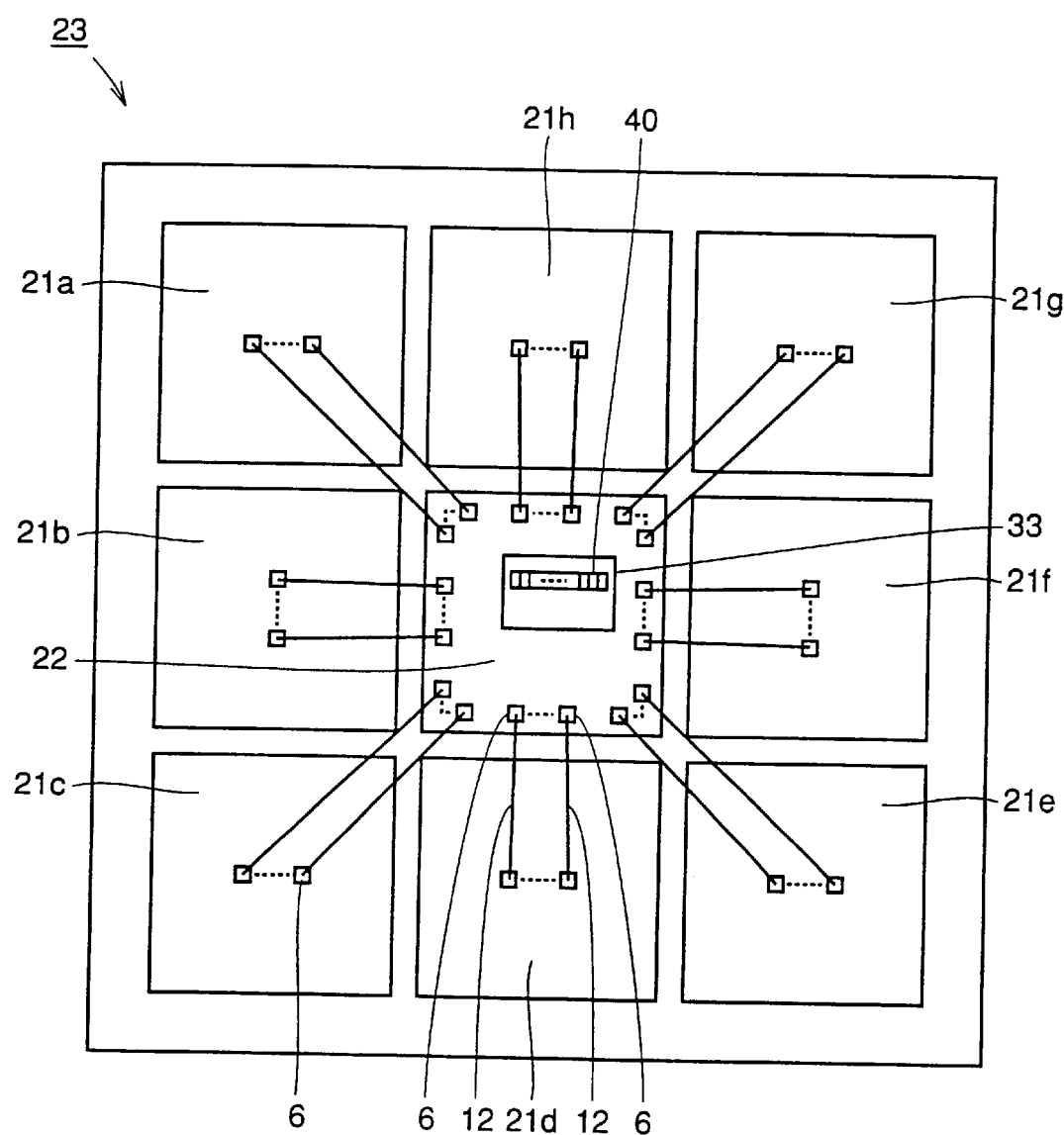
FIG. 6 is a plan view showing a DRAM according to the fourth embodiment of the invention.
Figure 7:
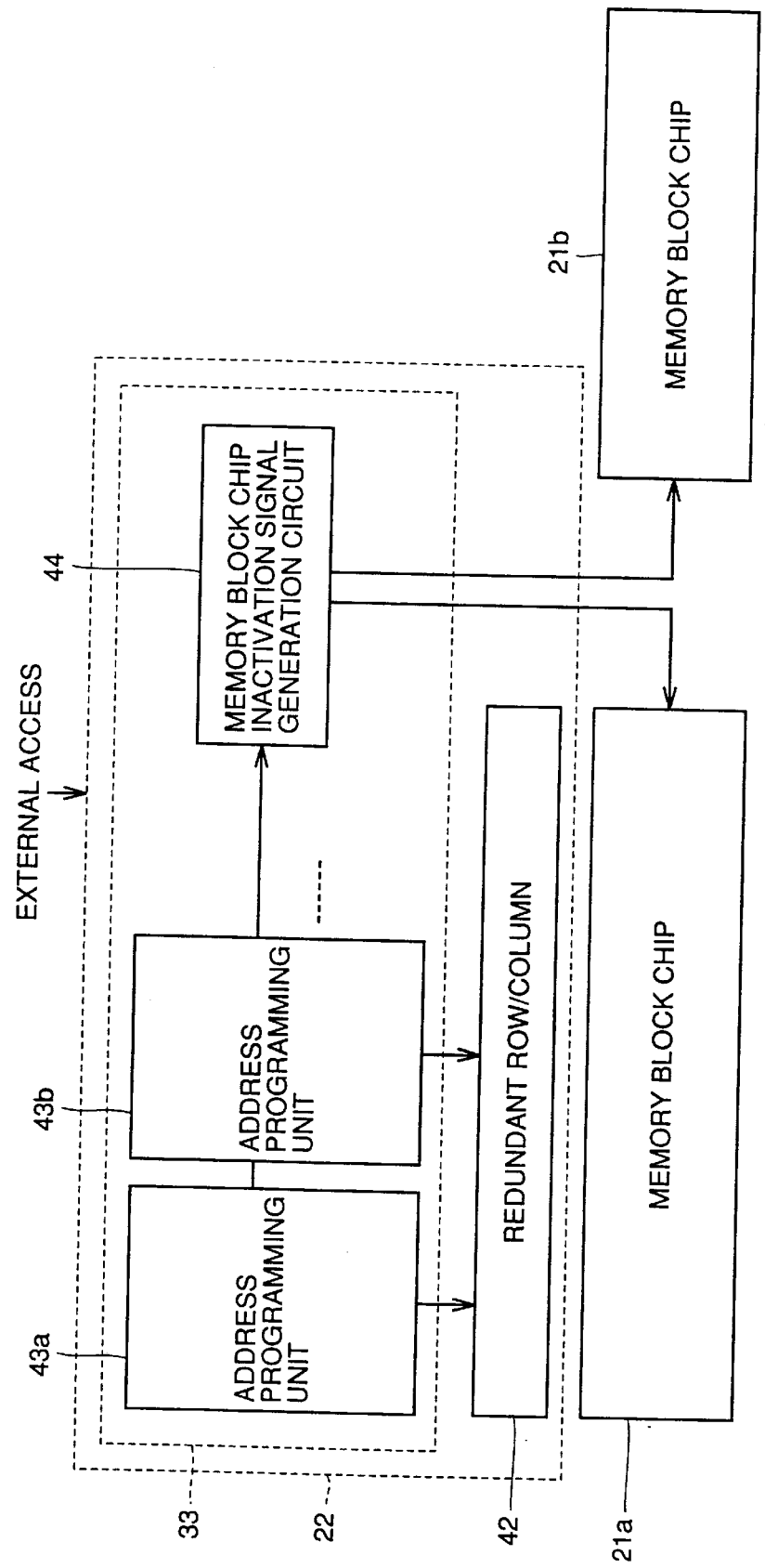
FIG. 7 is a block diagram showing one example of a structure of a redundancy programming circuit shown in FIG. 6.

The fourth embodiment of the invention is described using FIGS. 6 and 7. FIG. 6 is a plan view showing a multi-tip module 23 of the fourth embodiment as a model.

Referring to FIG. 6, redundancy programming circuit 33 is formed in control circuit chip 22 only according to the fourth embodiment. A plurality of fuses 40 for programming a defective address are therefore formed in control circuit chip 22 only.

Redundancy programming circuit 33 has a function of replacing a defective row/column in each of memory block chips 21a–21h with a redundant row/column. The redundant row/column may be provided in at least one of control circuit chip 22 and each of memory block chips 21a–21h.

A defective row/column in memory block chip 21a, for example, can be replaced with a redundant row/column in memory block chip 21b by providing redundancy programming circuit 33 having a function as described above to control circuit chip 22. If a redundant row/column is provided in control circuit chip 22, a defective row/column in each of memory block chips 21a–21h can be replaced with the redundant row/column in control circuit chip 22. Consequently, memory block chips 21a–21h which could not be repaired conventionally can be repaired using a redundant row/column in control circuit chip 22 or in other memory block chips 21a–21h so that yield can be improved.

One example of a structure of redundancy programming circuit 33 is next described using FIG. 7. FIG. 7 is a block diagram showing one example of the structure of redundancy programming circuit 33.

Referring to FIG. 7, redundancy programming circuit 33 includes address programming units 43a and 43b, and a memory block chip inactivation signal generation circuit 44. Address programming units 43a and 43b each stores an address of a redundant row/column 42, and supplies a signal which shows whether the stored address corresponds to a supplied address or not to memory block chip inactivation signal generation circuit 44. Memory block chip inactivation signal generation circuit 44 detects an access instruction to redundant row/column 42 output by address programming units 43a and 43b, and inactivates memory block chips 21a and 21b.

Redundancy programming circuit 33 includes address programming units 43a and 43b and memory block chip inactivation signal generation circuit 44 as described above. Accordingly, a defective row/column in any of all the memory block chips 21a–21h can be replaced with redundant row/column 42 in control circuit chip 22 by redundancy programming circuit 33. As a result, a defective row/column which cannot be repaired by a redundant row/column in any of all the memory block chips 21a–21h can be repaired using redundant row/column 42 in control circuit chip 22.

Redundant row/column 42 is also provided in each of memory block chips 21a–21h (not shown). Therefore, if there is a defective row/column which cannot be repaired in memory block chip 21a of FIG. 7, memory block chip 21a can be repaired by using a redundant row/column in memory block chip 21b. Accordingly, a defective row/column can be replaced with a redundant row/column between memory block chips.

Redundant row/column 42 may be placed only in control circuit chip 22 or in memory block chips 21a–21h. In this case, defective row/columns in all the memory block chips 21a–21h can be repaired using redundant row/column 42.

Further, redundancy programming circuit 33 itself can be provided in any of memory block chips 21a–21h. The effect as described above is also obtained. A redundant memory block chip including only redundant rows/columns can be provided in multi-tip module 23. In this case, a region where redundant row/column 42 is placed is unnecessary in control circuit chip 22 and memory block chips 21a–21h, so that higher integration of each chip is possible. In addition, even at the initial stage of mass production when the rate of defectiveness is high, an acceptable device can be fabricated since a number of redundant rows/columns 42 can be prepared.

(Fifth Embodiment)

Figure 8:
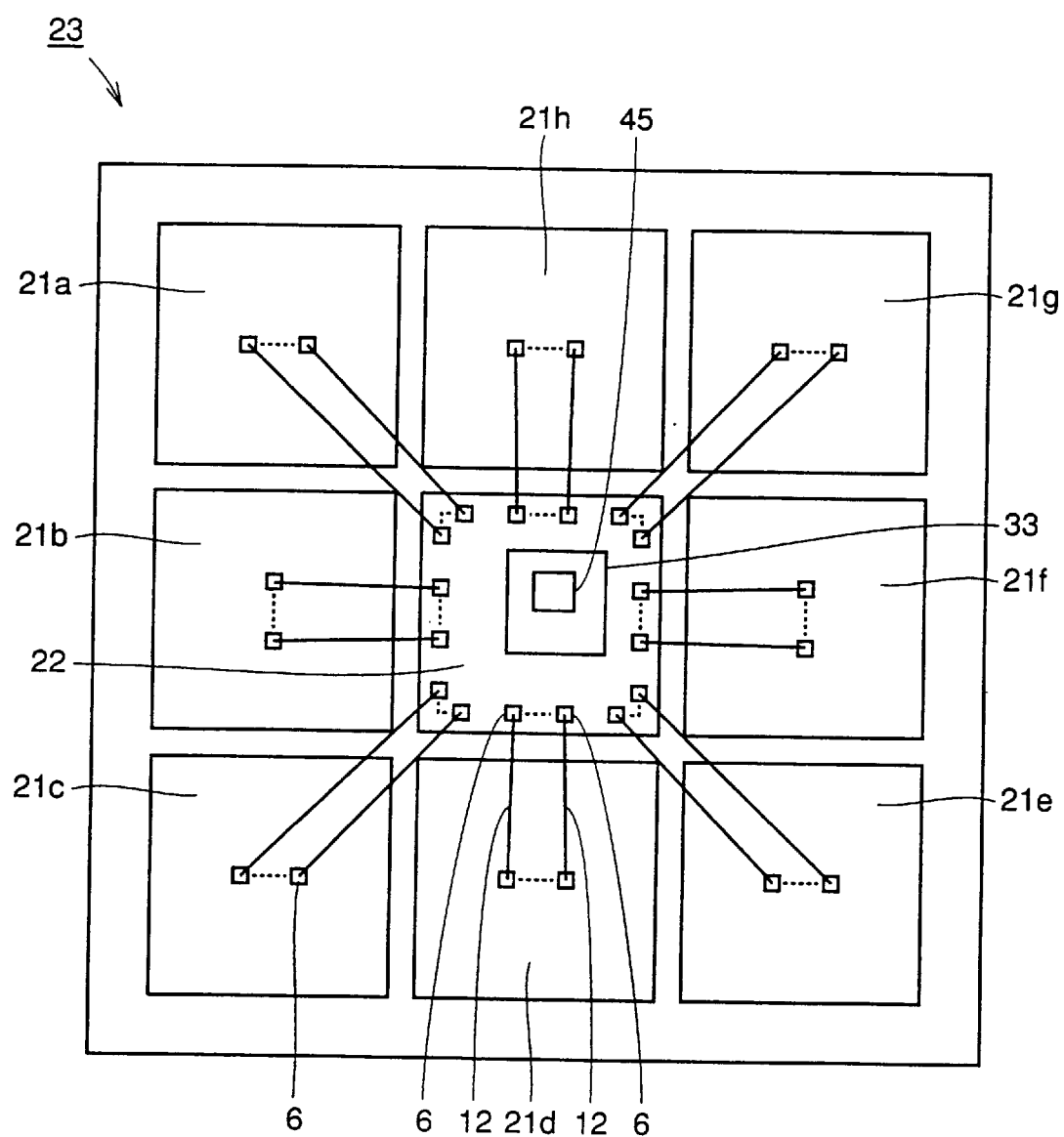
FIG. 8 is a plan view showing a DRAM according to the fifth embodiment of the invention.

The fifth embodiment of the present invention is hereinafter described using FIGS. 8 and 9. FIG. 8 is a plan view showing a structure of multi-tip module 23 of the fifth embodiment.

Referring to FIG. 8, according to the fifth embodiment, an antifuse element 45 is employed instead of fuse 40 of the fourth embodiment. Other structure is similar to that of the fourth embodiment.

The antifuse element can be easily formed in control circuit chip 22 since control circuit chip 22 and memory block chips 21a–21h are separately provided. By programming a defective address using the antifuse element, fuse blowing becomes unnecessary when a defective row/column is repaired and productivity is improved. Any element other than the antifuse element can be used if the element can be electrically programmed.

Figure 9:
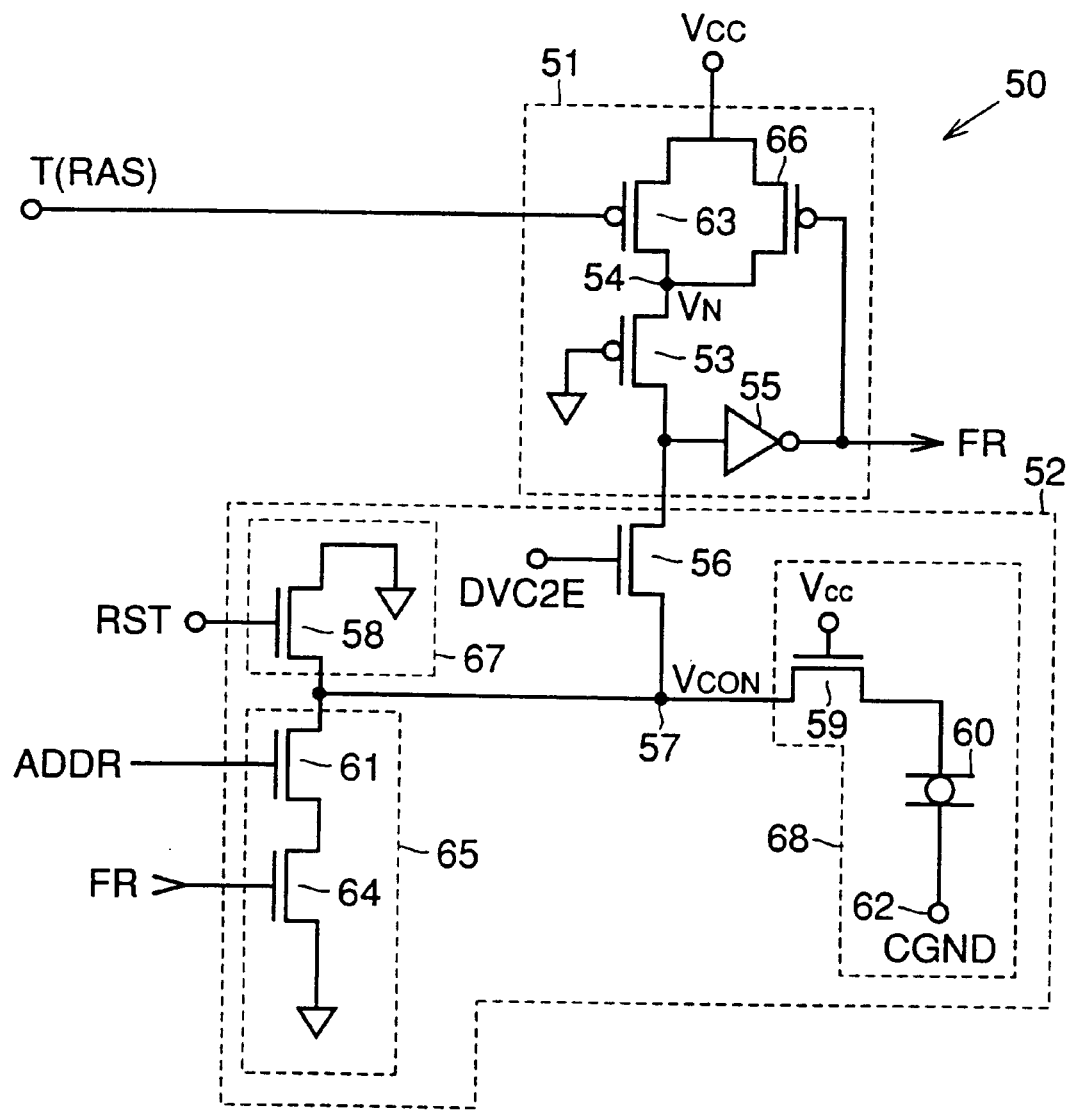
FIG. 9 is a circuit diagram showing an antifuse circuit.
Figure 10:
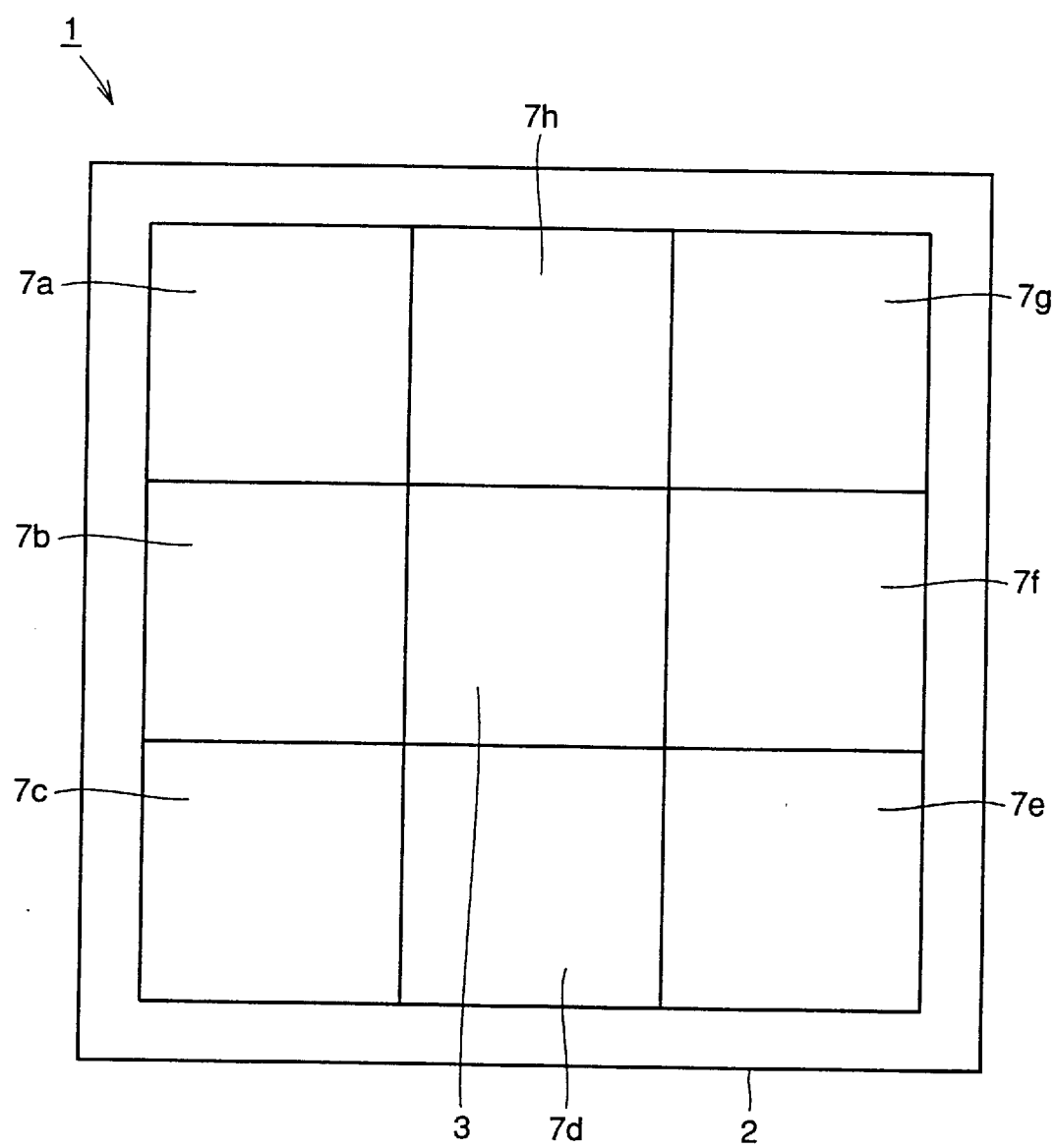
FIG. 10 is a plan view showing one example of a conventional DRAM.

Using FIG. 9, a method of programming using an element which can be electrically programmed such as the antifuse element is described. FIG. 9 is a circuit diagram showing an antifuse circuit 50 disclosed in, for example, U.S. Pat. No. 5,631,862. Instead of an antifuse 60 in the antifuse circuit 50, an element which can be electrically programmed can be used. The antifuse here functions as a fuse by causing dielectric breakdown of an insulating film with application of high potential to a capacitor-like element.

Referring to FIG. 9, antifuse circuit 50 receives three major signals that are trigger signal T(RAS), device enable signal DVC2E, and reset signal RST. Trigger signal T(RAS) is an inter-chip signal used in many memory elements that is obtained by delaying row address selection signal RAS. T(RAS) is active (low) during address detection, and inactive (high) during other operations. Device enable signal DVC2E is a conventional inter-chip signal having its amplitude which is approximately half of that of supply potential Vcc.

In addition to T(RAS), DVC2E, and RST, antifuse circuit 50 receives switchable signal CGND at a switchable node 62. In a normal operation, switchable signal CGND is grounded for supplying a reference potential to antifuse 60. When antifuse 60 is blown, switchable signal CGND normally has a high potential of at least 10 V.

Antifuse circuit 50 is formed of two major portions that are an output latch 51 and a latch control unit 52. Latch control unit 52 includes a reference path 65, a reset path 67, and an antifuse sense path 68. The gate of transistor 53 is grounded so that transistor 53 is always in the ON state. Transistor 53 is a high resistance load inserted between a node 54 and an inverter 55.

In a normal operation, a control transistor 56 is turned on by device enable signal DVC2E to connect a control node 57 to an input of inverter 55. A driving ability of control transistor 56 is set higher than that of transistor 53. Accordingly, the input of inverter 55 is controlled by control potential Vcon of control node 57.

A reset transistor 58 has a high current driving ability and its channel width is sufficiently large relative to its channel length. Consequently, reset transistor 58 and control transistor 56 that are serially coupled to each other can set the input of inverter 55 at ground potential when reset signal RST goes high, overcoming transistor 53.

A drop transistor 59 is always in the ON state since its gate is connected to Vcc. Therefore, drop transistor 59 operates as a resistor arranged between control node 57 and antifuse 60. Drop transistor 59 restricts the maximum potential on control node 57 to a value obtained by subtracting threshold potential Vt of drop transistor 59 from supply potential Vcc. Further, drop transistor 59 restricts drain-gate potential of reset transistor 58 and transistor 61 and source-gate potential of control transistor 56 to at most a potential at which breakdown of a gate oxide film is caused.

Before antifuse 60 is blown, trigger signal T(RAS) goes high, transistor 61 is turned on, and transistor 63 is turned off. Reset signal RST next goes high during a short period. Since reset signal RST is high, reset transistor 58 is turned on and control potential Vcon goes low. Accordingly, the input of inverter 55 is set low. Output signal FR accordingly goes high and a disconnection transistor 64 is turned on. Reference path 65 connects control node 57 to ground potential.

After a period which is sufficient to set an output latch 51, reset signal RST returns to low, and reset transistor 58 is turned off. Control node 57 is continuously grounded via transistor 61 and disconnection transistor 64. When reset signal RST returns to low, switchable signal CGND applies 12V to switchable node 62 to blow antifuse 60. Resistance value decreases when antifuse 60 is blown, and switchable signal CGND is continuously connected to ground potential through control node 57 and reference path 65.

Antifuse 60 is thus blown and a function as a fuse is thus provided. By replacing antifuse 60 with an element which can be electrically written, a defective row/column can be repaired without fuse blowing.

Although the number of memory blocks is 8 in each of the embodiments above, an arbitrary number of memory blocks can be selected. In this case, a control circuit portion should be arranged such that signal delay between each memory block and the control circuit portion is uniform. In addition, the present invention is applied to the DRAM as one example of a semiconductor memory device in each of the embodiments. However, the invention is applicable to a semiconductor memory device other than the DRAM such as an SRAM (static random access memory) and the like. Further, characteristics of respective embodiments can be combined.

According to one aspect of the semiconductor memory device of the invention, a heat radiation member is selectively provided on a control circuit portion. Consequently, an efficient heat radiation from the semiconductor memory device is achieved to provide a highly reliable semiconductor memory device.

According to another aspect of the semiconductor memory device of the invention, a second chip is provided above a control circuit portion. Since the second chip is provided, functions of the MPU and the like can be selectively provided to the second chip. Various semiconductor memory devices with high performance is thus obtained.

According to still another aspect of the semiconductor memory device of the invention, memory block chips and a control circuit chip are provided. A memory block and a control circuit portion are formed on separate chips. Consequently, if only one memory block chip cannot be repaired by redundancy repairing means, for example, the memory block chip only is replaced with an acceptable memory block chip to prevent other memory block chip from discarded. As a result, yield can be enhanced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:

a first chip including a plurality of memory blocks each having a plurality of memory cells and including a control circuit portion surrounded by said plurality of memory blocks and having a control circuit which controls operations of said memory cells;

a bump electrode formed around said control circuit portion; and a second chip connected to said first chip via said bump electrode and arranged above said control circuit portion, said second chip having its size substantially identical to that of said control circuit portion, including a heat radiation member provided inward from its outer periphery and including at least one electrode adjacent said radiation member for connection with an external component.

2. The semiconductor memory device according to claim 1, wherein said heat radiation member for radiating heat generated at said control circuit portion or said second chip is provided on at least one of the front surface of said second chip and a back surface of said control circuit portion.

3. The semiconductor memory device according to claim 2, wherein the heat radiation member is laterally bounded by a periphery of the control circuit portion.

4. The semiconductor memory device according to claim 2, wherein the second chip comprises at least one of a MPU, Cache, BIST circuit, and DRAM.

* * * * *